United States Patent [19]
Ikeda et al.

[11] Patent Number: 5,224,114
[45] Date of Patent: Jun. 29, 1993

[54] SEMICONDUCTOR LASER DEVICES WITH A PLURALITY OF LIGHT EMITTING LAYERS HAVING DIFFERENT BANDS GAPS AND METHODS FOR DRIVING THE SAME

[75] Inventors: Sotomitsu Ikeda, Zama; Jun Nitta, Sagamihara, both of Japan

[73] Assignee: Canon Kabushiki Kaisha, Tokyo, Japan

[21] Appl. No.: 936,737

[22] Filed: Aug. 31, 1992

Related U.S. Application Data

[63] Continuation of Ser. No. 788,449, Nov. 6, 1991, abandoned.

[30] Foreign Application Priority Data

Nov. 11, 1990 [JP] Japan ................................. 2-304407

[51] Int. Cl.$^5$ .............................................. H01S 3/19
[52] U.S. Cl. ............................................... 372/45
[58] Field of Search ......................... 372/45–50; 357/4, 16, 30

[56] References Cited

U.S. PATENT DOCUMENTS

| | | | |
|---|---|---|---|
| 4,799,229 | 1/1989 | Miyazawa et al. | 372/50 |
| 4,817,110 | 3/1989 | Tokuda et al. | 372/45 |
| 4,819,036 | 4/1989 | Kuroda et al. | 357/4 |
| 4,881,235 | 11/1989 | Chinone et al. | 372/45 |
| 4,993,036 | 2/1991 | Ikeda et al. | 372/50 |
| 5,033,053 | 7/1991 | Shimizu et al. | 372/50 |
| 5,060,235 | 10/1991 | Ikeda | 372/45 |

FOREIGN PATENT DOCUMENTS

| | | |
|---|---|---|
| 0390167 | 10/1990 | European Pat. Off. |
| 0390200 | 10/1990 | European Pat. Off. |
| 63-32982 | 2/1988 | Japan |

OTHER PUBLICATIONS

Jap. J. Appln. Physics (1989) 28-30 Aug., pp. 317-320, Ikeda et al. "Wavelength switching of asymmetric dual quantum well lasers."

App. Phys. Let. vol. 55, No. 20, Nov. 13, 1989, pp. 2057-2059, Ikeda et al., "Wide-range wavelength tuning etc."

App. Phys. Let. vol. 55, No. 12, Sep. 18, 1989, pp. 1155-1157, Ikeda et al., "Asymmetric dual quantum well laser etc."

Appl Phys. Let. vol. 59, No. 7, Aug. 12, 1991, pp. 765-676, Shimizu et al. "Theory of asymmetric quantum well lasers."

Applied Physics Letters, vol. 36, No. 6, Mar. 15th, 1980, pp. 441-443, Tsang, W. T., "CW Multiwavelength Transverse-Junction-Stripe Lasers Grown By Molecular Beam Epitaxy Operating Predominantly In Single-Longitudinal Modes".

Primary Examiner—Akm E. Ullah
Attorney, Agent, or Firm—Fitzpatrick, Cella, Harper & Scinto

[57] ABSTRACT

A semiconductor laser device usable as a tunable laser, optical amplifier, optical wavelength converter and the like includes a plurality of light emitting layers, a barrier layer formed between the light emitting layers, a pair of light-electron confinement layers for sandwiching the light emitting layers and the barrier layer. Band gaps of ground levels of the light emitting layers are different from each other, a band gap of the barrier layer is larger than those of the light emitting layers and band gaps of the light-electron confinement layers are different from each other. Further, the light emitting layers, the barrier layer and the light-electron confinement layers are formed such that, when carriers are injected into the light emitting layers, a carrier density of the light emitting layer having a larger band gap is made higher and a carrier density of the light emitting layer having a smaller band gap is made lower than at least one of cases where the barrier layer is omitted and where a pair of the light-electron confinement layers are symmetrically formed with respect to the light emitting layers.

54 Claims, 8 Drawing Sheets

SEMICONDUCTOR LASER DEVICES WITH A PLURALITY OF LIGHT EMITTING LAYERS HAVING DIFFERENT BANDS GAPS AND METHODS FOR DRIVING THE SAME

This application is a continuation of application Ser. No. 07/788,449 filed Nov. 6, 1991 abandoned.

BACKGROUND OF THE INVENTION

1. Field of the Invention

This invention relates to semiconductor laser devices with a plurality of light emitting layers having different band gaps and methods for driving the same which are to be utilized in wavelength or frequency division multiplexing optical communication systems, wavelength division multiplexing optical recording systems, optocal operation systems and the like and, more particularly, to semiconductor laser devices for emitting laser lights of different wavelengths by controlling the magnitude of a current injected thereinto and driving methods therefor.

2. Related Background Art

In recent years, demands for semiconductor laser devices have rapidly been increasing in fields of optical communications and optical information processings, and accompanied therewith requirements for functions of devices to be used in such fields have become diverse. Among them, there exist tunable (wavelength of a radiated light is changeable) semiconductor laser devices. For example, in a case where a laser light is applied to a record medium such as an optical card and an optical disc for performing information recording and reproduction, information writing by a reproducing light is normally prevented by reducing the magnitude of the reproducing light to a value less than that of a recording light for recording information on the record medium. In this case, if a tunable semiconductor laser is used and a wavelength of its reproducing light is set to be within a range in which a light sensitivity of a medium is low, the prevention of information writing by the reproducing light is effected without reducing the magnitude thereof so much. Thus, the reproduction of information can be performed with a high S/N ratio by the reproducing light having a sufficient magnitude.

In order to satisfy the above-mentioned requirement, there has been developed a first prior art tunable laser device in which light emitting layers for selectively emitting lights of different wavelengths are respectively formed in different light waveguides formed on a common substrate and a laser oscillation is conducted in the light emitting layer of a desired oscillation wavelength by a current injection thereinto (see Appl. Phys. Lett. vol. 36, p. 442(1980)). In this case, it can be said that essentially separate or independent laser devices are formed on a common substrate.

The first prior art device, however, has the following disadvantages.

When the emission or oscillation wavelength is changed, the location of light emission from the device is varied. As a result, for example, where an external optical system for condensing a radiated light from the laser device is structured so that the light of a certain wavelength is condensed into a point, a focused position will be shifted far greater than a small shift due to a wavelength dispersion caused when the emission wavelength is changed. Further, since there is a need to form separate, independent laser devices on a common substrate and to drive them separately, a fabrication process will be complicated and a size of the device will be large.

Next, there has been developed a second prior art tunable laser device which is a distributed Bragg reflector (DBR) type semiconductor laser using a grating as a reflector. In the device, an electrode is further provided in the grating portion for injecting carriers therethrough, and an amount of injection current thereinto is increased or reduced so that the oscillation wavelength is changed by varying a refractive index of the grating portion. In this case, structures of light emitting layers, etc., are the same as those of a normal semiconductor laser.

The second prior art device, however, has a drawback as follows. A range of variable wavelength is narrow, and in a case where, for example, $Al_xGa_{1-x}As$ is used, such range is several nanometers. This is because the change of Bragg wavelength by the control of an amount of current injection which has such length of range decides the width or range of variable wavelength.

There has further been developed a third prior art tunable laser device in which a single quantum well layer constitutes of a light emitting layer and a light emission from a quantum energy level higher than a first or ground one is made possible by increasing loss of its resonator. Laser oscillations of different wavelengths are obtained from light emissions from the first and second quantum levels.

Figure 1A:
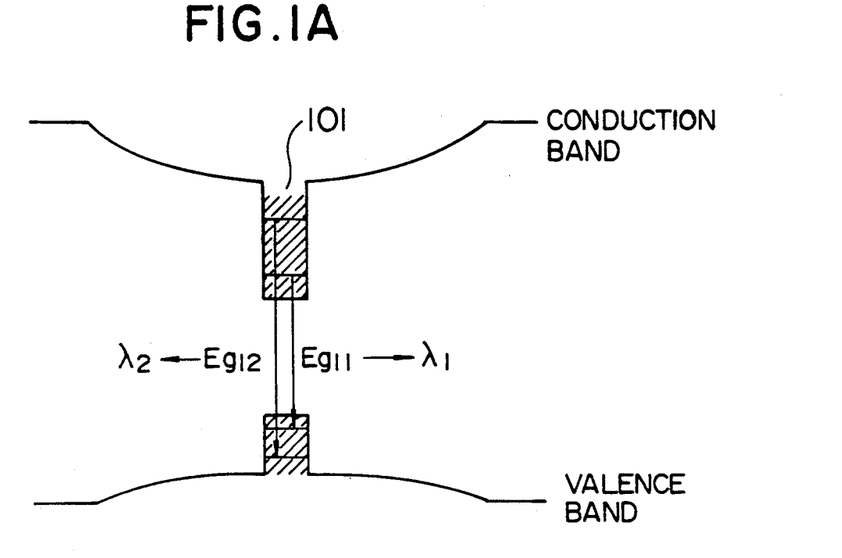
FIG. 1A is a representation of a band structure of a light waveguide portion in a prior art semiconductor laser device having a single quantum well layer as an active layer.
Figure 1B:
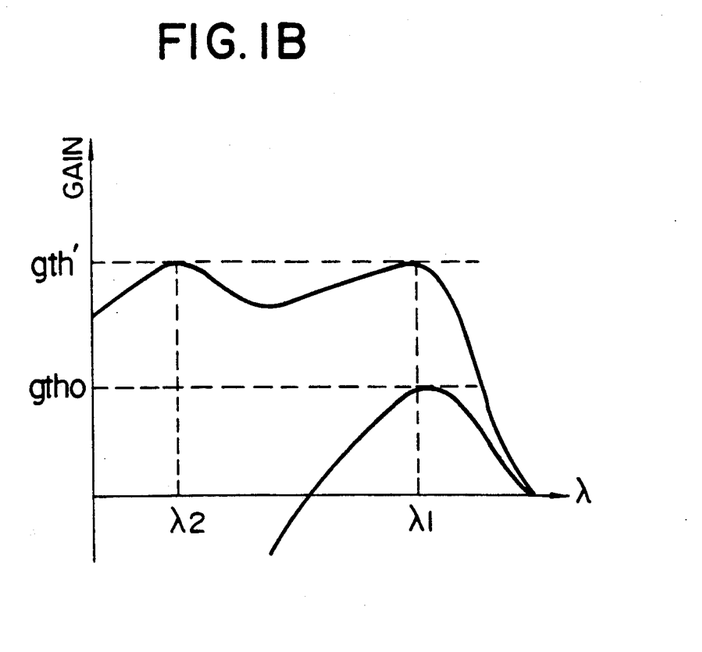
FIG. 1B is a representation of a gain spectrum of the device of FIG. 1A.

FIG. 1A shows an energy band of such single quantum well layer 101 and layers adjacent thereto. FIG. 1B shows its gain spectrum. In a laser having a conventional normal resonator loss, an oscillation threshold gain is $g_{tho}$, and its gain spectrum has a peak at a wavelength $\lambda_1$ corresponding to an energy gap $E_{g11}$ for the first quantum energy level at which the laser oscillation is performed. In the third prior art device, its resonator loss is increased, and its oscillation threshold gain is $g_{tho}'$. Thus, the laser oscillation of a wavelength $\lambda_2$ corresponding to an energy gap $E_{g12}$ for the second quantum level is made possible.

In the third prior art device, however, the laser efficiency becomes small because the resonator loss is increased for achieving its object. As a result, the oscillation threshold current should be made large and its output cannot be made large. Therefore, a continuous emission at room temperature could not be obtained in such device which is to be act as a two-wavelength tunable laser.

Moreover, there has been disclosed a fourth prior art device in Japanese patent pre-examined publication No. 63-32982. In the fourth prior art device, there are provided two different quantum well layers respectively functioning as light emitting layers for emitting lights of slightly different wavelengths and laser oscillations of different wavelengths are achieved by the respective quantum well layers.

The fourth prior art device, however, also has the drawback that two oscillation wavelengths are quite close to each other or that its range of variable wavelength is narrow.

SUMMARY OF THE INVENTION

An object of this invention is to provide a tunable semiconductor laser device which has a wide range of variable oscillation wavelength and operates with a high efficiency and a method for driving such semiconductor laser device.

According to one aspect of the present invention, a semiconductor laser device includes a plurality of light emitting layers, a barrier layer formed between the light emitting layers, a pair of light-electron confinement layers for sandwiching the light emitting layers and the barrier layer. Band gaps of ground levels of the light emitting layers are different from each other, a band gap of the barrier layer is larger than those of the light emitting layers and band gaps of the light-electron confinement layers are different from each other. Further the light emitting layers, the barrier layer and the light-electron confinement layers are formed such that, when carriers are injected into the light emitting layers, a carrier density of the light emitting layer having a larger band gap is made higher and a carrier density of the light emitting layer having a smaller band gap is made lower than at least one of cases where the barrier layer is omitted and where a pair of the light-electron confinement layers are symmetrically formed with respect to the light emitting layers.

According to one aspect of a method for driving the above-mentioned laser device of the present invention, a method includes a step of injecting a current in a forward direction into the laser device, a step of controlling an amount of the current and a step of performing a laser oscillation of light having a wavelength corresponding to a desired one of the band gaps of the light emitting layers.

According to another aspect of a method for driving the above-mentioned laser device of the present invention, a method includes a step of injecting a current having an amount slightly smaller than that of a threshold current for performing a laser oscillation, into the device, a step of causing an incident light having a wavelength close to that of a laser oscillated light to enter the device through its one end surface and a step of taking out a light having the same wavelength as that of the incident light through the other end surface of the device.

According to still another aspect of a method for driving the above-mentioned laser device of the present invention, a method includes a step of injecting a current having an amount slightly smaller than that of a threshold current for performing a laser oscillation, into the device, a step of causing an incident light having a wavelength close to that of a laser oscillated light to enter the device through its one end surface and a step of taking out a light having a wavelength different from that of the incident light through the other end surface of the device.

The band gap in this specification means a transition energy from a certain energy level in the valence band to a certain energy level in the conduction band including a quantum energy in a case of a quantum well structure.

According to the present invention, disadvantages mentioned above have been solved.

As for the disadvantages of the first prior art device, in the laser device of this invention, light emitting layers for different oscillation wavelengths are formed in a single light waveguide, so that a light emission position will not be changed even if the oscillation wavelength is changed. Further, there is no need to provide separate and independent current injection means for respective oscillation wavelengths, so that its fabrication is easy and a size of the device is about equal to that of conventional semiconductor lasers.

As for the disadvantages of the second prior art device, in the laser device of this invention, since respective wavelength oscillations are performed by separate light emitting layers formed on a single light waveguide, so that a changeable oscillation can be conducted in a wider range of wavelength. For example, when $Al_xGa_{1-x}As$ is used to form the light emitting layers, oscillation wavelengths can be changed in a range having a width from several tens $\mu m$ to several hundreds nm.

As for the disadvantages of the third prior art device, in the laser device of this invention, since there is provided a barrier layer having a larger band gap than those of adjacent light emitting layers and formed between these light emitting layers and the band gap and thickness of the barrier layer, for example, are set such that, when carriers are injected into the light emitting layers, a carrier density of the light emitting layer having a larger band gap is made higher and a carrier density of the light emitting layer having a smaller band gap is made lower than a case where the barrier layer is omitted, the gain distribution extends toward a short wavelength compared with the prior art device when the same amount of carriers are injected into the device. As a result, lights of plural wavelengths can be oscillated even unless the resonator loss is increased and a large amount of current is injected.

Further, the barrier layer (or light emitting layer in addition thereto) is preferably doped with p or n type dopants in order to further a hight efficiency of the laser device of this invention. Especially, it is preferable to perform the doping of a polarity opposite to that of carriers (electrons or holes) which are to be unevenly injected. This is because carriers to be evenly injected can be supplemented by the doping beforehand.

Due to the above-discussed structure, the efficiency of laser becomes extremely higher than the conventional laser devices, and a tunable laser which has an oscillation threshold current value equal to or twice less than a value of conventional semiconductor lasers (not tunable) can be achieved. Especially, a continuous oscillation at room temperature can be achieved, which could not be obtained in conventional tunable devices having a wide range of oscillation wavelength.

As for the disadvantages of the fourth prior art device, in the laser device of this invention, since there can be provided light emitting layers having greatly different wavelengths and the device is structured in a manner mentioned above, these advantages can be solved. It should be noted that a light having a short wavelength cannot be oscillated unless a large amount of current is injected only by simply making the wavelength difference of the light emitting layers large. Therefore, the same problems as those of the third prior art device remain. According to this invention, not only such wavelength difference is made large, but also a flow of carriers is skillfully controlled by the height and thickness of the barrier layer, the doping and so forth, so that a highly efficient tunable laser having a great difference of oscillation wavelength can be realized.

These advantages and others will be more readily understood in connection with the following detailed description, claims and drawing.

DESCRIPTION OF THE PREFERRED EMBODIMENT

Embodiments will be explained referring to FIGS. 2A-6 in the following. In the following embodiments, emission wavelengths are two and hence two light emitting layers are provided. The number thereof may naturally be more than two. The principle is the same in all these cases.

Figure 2A:
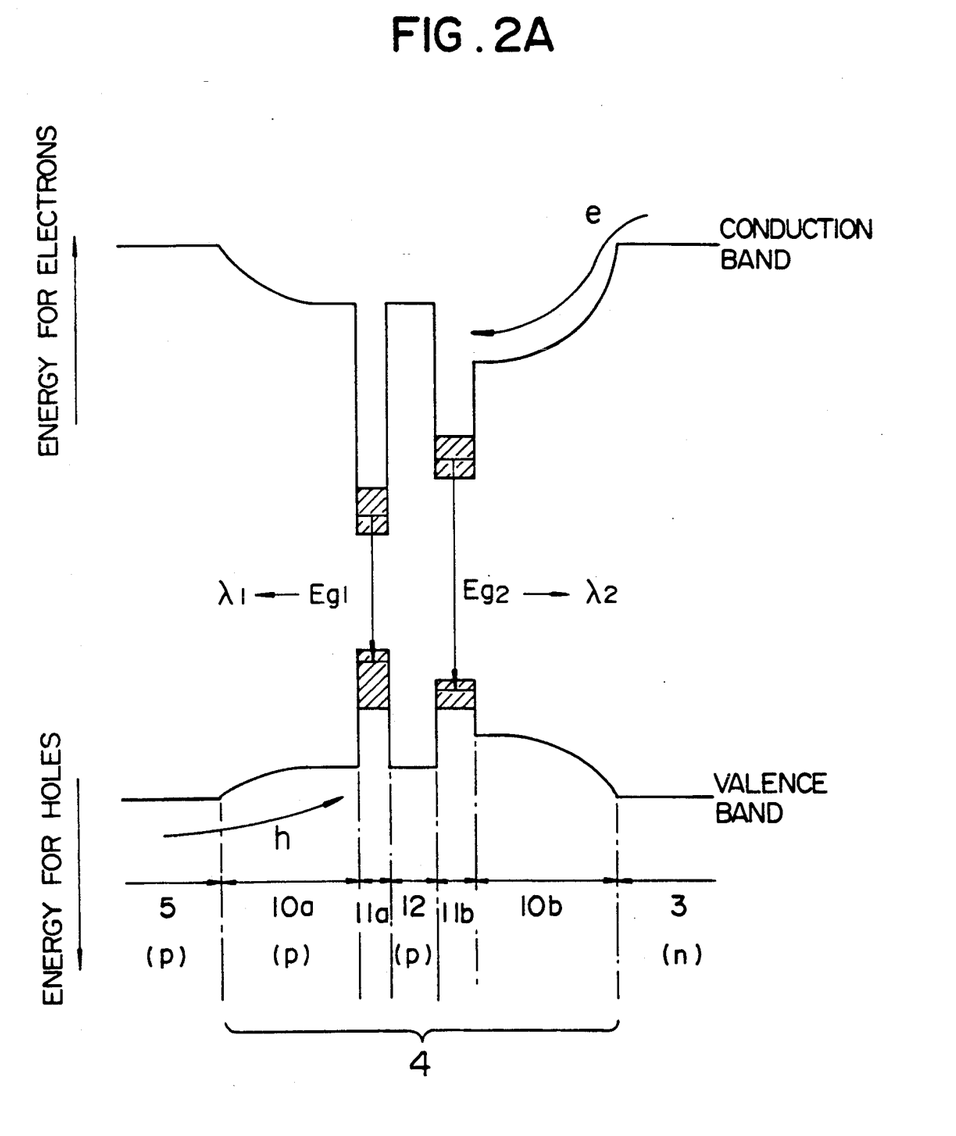
FIG. 2A is a representation of a band structure of a light waveguide portion in a first embodiment of a semiconductor laser device according to the present invention.

FIG. 2A illustrates the energy band structure of an active layer 11a and 11b and layers adjacent thereto of a first embodiment of the semiconductor laser. In FIG. 2A, there are depicted energy levels of p-$Al_{xs}Ga_{1-xs}As$ light-electron separate confinement layer (SC layer) 10a, n-$Al_{xs'}Ga_{1-xs'}As$ SC layer 10b, $Al_{xa}Ga_{1-xa}As$ light emitting layer 11a, $Al_{xb}Ga_{1-xb}As$ light emitting layer 11b, p+-$Al_{xB}Ga_{1-xB}As$ barrier layer 12. These layers constitute a light waveguide structure portion 4.

In the first embodiment, the light emitting layer 11b for short wavelength emission ($\lambda_2$) is provided at the side of an n-cladding layer 3 and the light emitting layer 11a for long wavelength emission ($\lambda_1$) is provided at the side of a p-cladding layer 5, so that it is difficult for holes injected from the side of the p-cladding layer 5 to reach the light emitting layer 11b for short wavelength $\lambda_2$ compared with a case where holes move in a reverse direction. Therefore, the barrier layer 12 is doped with a high concentration of p-type dopants and thus holes are supplied beforehand. Here, the short wavelength $\lambda_2$ corresponds to an energy gap $E_{g2}$ between energy levels in conduction and valence bands of the light emitting layer 11b, and the long wavelength $\lambda_1$ corresponds to an energy gap $E_{g1}$ between energy levels in conduction and valence bands of the light emitting layer 11a.

Since holes are supplied sufficiently, holes are properly distributed over the light emitting layers 11a and 11b when no current is injected into the device. In this case, the distribution of electrons has only to be considered for discussing the laser oscillation. The operation of such case will be explained. A case where p and n are exchanged with each other will also be discussed below.

The SC layers 10a and 10b function to effectively capture injected electrons and injected holes into the active layers 11a and 11b and increase the recombination efficiency of carriers.

In the first embodiment, the SC layers 10a and 10b sandwiching the active layers 11a and 11b (quantum well layers) are asymmetrically formed, so that an injected carrier density in the quantum well layer 11b closer to the SC layer 10b having a smaller band gap is enhanced compared with that in the quantum well layer 11a closer to the SC layer 10a having a larger band gap. As a result, the gain of the quantum well layer 11b at the side of the SC layer 10b having a smaller band gap is increased.

In a conventional semiconductor laser, injected carriers are distributed over light emitting layers of an active layer structure in a thermal equilibrium state, so that the gain of the light emitting layer having a smaller energy gap becomes extremely large but that the gain of the other light emitting layer having a larger energy gap cannot become large enough.

Therefore, in the first embodiment, parts of the barrier layer 12 and the SC layer 10a are doped with p type dopants to supply sufficient holes to the light emitting layers 11a and 11b. On the other hand, electrons are injected from the n cladding layer 3 and fall into the light emitting layer 11b through the SC layer 10b having a smaller band gap. At this time, since the band gap of the barrier layer 12 is large, most of the electrons cannot travel over the barrier layer 12. Thus, the electron density of the light emitting layer 11b is further increased.

At this time, the thickness of the light emitting layer 11a having a smaller band gap is set to less than a scattering length of carrier (for example, less than about 100 Å since energy is lowered by 37 meV in a case of longitudinal optical (LO) phonon scattering). Hence, only a small amount of the injected carriers are captured in the light emitting layer 11a and a large amount of carriers are captured in the light emitting layer 11b.

Further, the thickness and potential hight (depth) of the barrier layer 12 are set to sufficient magnitudes, so that the carrier distribution in the light emitting layers or well layers 11a and 11b is as shown in FIG. 2A when a current close to the laser oscillation threshold value is injented. Namely, the carrier density of the light emitting layer 11b having a larger band gap is made relatively high.

If the barrier layer 12 is too thin or too low, the carrier distribution becomes uniform or even similar to a case where there is provided no barrier layer. But in the case of FIG. 2A the barrier layer 12 is set such that a larger amount of electrons are supplied to the well layer 11b for short wavelength $\lambda_2$. However, if the barrier layer 12 is too thick and/or too high, electrons could not reach the well layer 11a. Therefore, factors of the barrier layer 12 should be optimized.

Figure 2B:
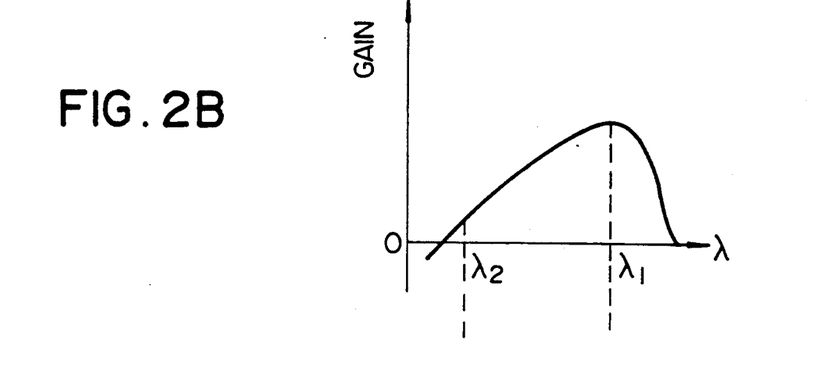
FIGS. 2B-2D are respectively representations of gain spectra of the device of FIG. 2A.
Figure 2C:
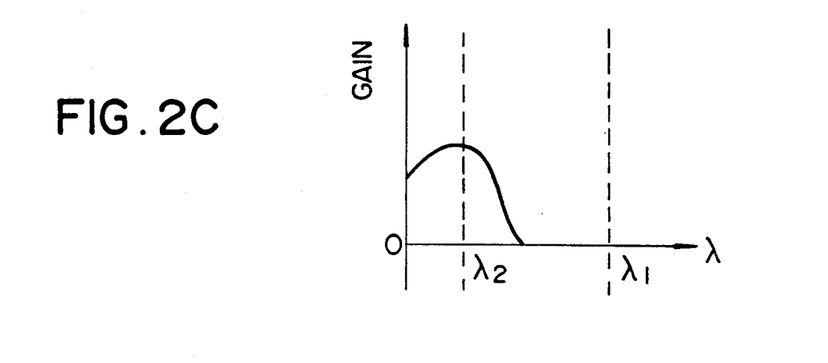
Figure 2D:
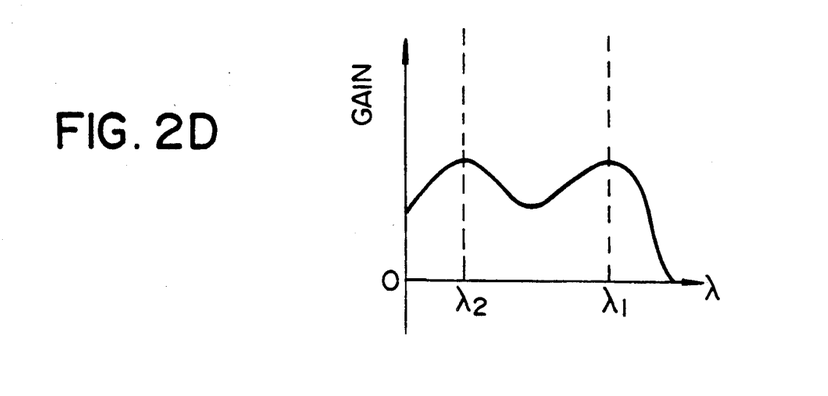

FIGS. 2B and 2C respectively show the gain spectra of the well layers 11a and 11b wherein a current slightly smaller than a threshold current is injected, and FIG. 2D shows the gain spectrum resulting from the sum of these spectra considering a light confinement coefficient.

As seen from FIG. 2D, gains for respective wavelengths $\lambda_1$ and $\lambda_2$ are decided by gains of the respective well layers 11a and 11b for those wavelengths shown in FIGS. 2B and 2C. Hence, the gains for the wavelengths $\lambda_1$ and $\lambda_2$ can effectively be increased.

In the first embodiment, the SC layers 10a and 10b respectively employ graded index (GRIN) structures. The GRIN structure may be replaced with a step index type in which the energy gap or refractive index varies in a stepped form, a structure in which the energy gap is changed linearly, or the like. A necessary thing is to form the SC layers 10a and 10b having an asymmetric band gap with respect to plural light emitting layers 11a and 11b therebetween.

In the first embodiment, the band gap of the barrier layer 12 is set equal to the band gap of a portion of the SC layer 10a adjacent to the light emitting layer 11a. But, the band gap of the barrier layer 12 has only to be set larger than that of a portion of the SC layer 10b adjacent to the light emitting layer 11b and smaller than those of the cladding layers 3 and 5.

Figure 3A:
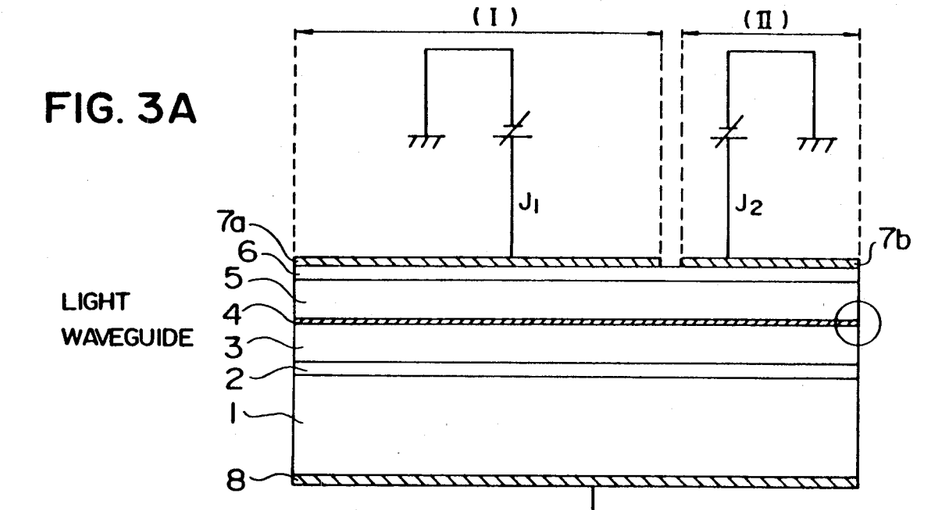
FIG. 3A is a side cross-sectional view showing a first embodiment of a ridge waveguide type semiconductor laser device.
Figure 3B:
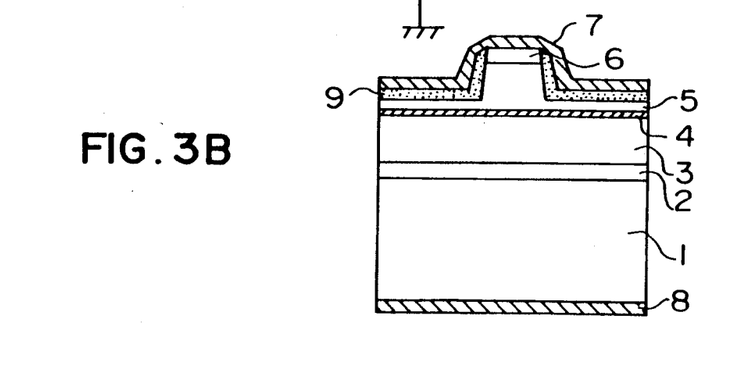
FIG. 3B is a front cross-sectional view showing the first embodiment.
Figure 3C:
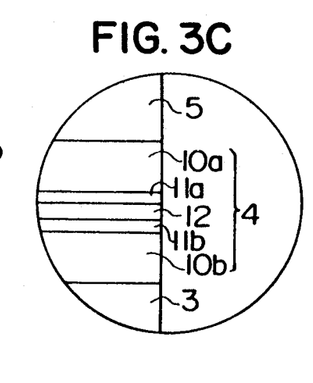
FIG. 3C is a blowup of a portion of FIG. 3A.

FIG. 3A shows a side cross-sectional view of a concrete layered structure of the first embodiment of the semiconductor laser device, and FIG. 3B shows a front cross-sectional view thereof. Such structure can be formed using molecular beam epitaxy (MBE) method, metal organic-chemical vapor deposition (MOCVD) method or the like. Such process is the same as that used in a case where conventional semiconductor lasers are formed.

In FIGS. 3A and 3B, there are provided on an n+-GaAs substrate 1 an n+-GaAs buffer layer 2, n-$Al_{xc}Ga_{1-xc}As$ cladding layer 3, the above-discussed light waveguide structure portion 4, p-$Al_{xc}Ga_{1-xc}As$ cladding layer 5, p+-GaAs cap layer 6, Au/Cr electrode 7 and Au—Ge/Au electrode 8.

As shown in FIG. 3B, a ridge (raised channel) type waveguide is formed by reactive ion beam etching (RIBE) method or the like in order to confine electrons and light in a stripe-shaped region with respect to a lateral or horizontal direction. After an $Si_3N_4$ layer 9 is deposited by plasma CVD method, only the layer 9 on the ridge top is removed by etching and then the electrode 7 is deposited.

As a means for regulating an emission wavelength, the electrode 7 is divided into two parts 7a and 7b as shown in FIG. 3A, and currents $J_1$ and $J_2$ are to be independently injected through the two parts 7a and 7b of the electrode 7 separately. Currents are respectively injected through the two electrodes 7a and 7b with different current densities $J_1$ and $J_2$. The wavelength dispersion of an effective gain of the entire laser is slightly changed by changing a ratio and magnitudes of the current densities $J_1$ and $_2$. Thus, the oscillation wavelength is varied.

As a method for changing the oscillation wavelength, there are other methods than that mentioned above. For example, a single electrode is used and the wavelength is controlled by the magnitude of current flowing through the single electrode. In this case, it was confirmed that light of a longer wavelength $\lambda_1$ is first oscillated and then light of a shorter wavelength $\lambda_2$ is also oscillated as the injection current is increased. If the current is further increased, there are two cases. In the first case, the oscillation of light of a longer wavelength $\lambda_1$ ceases. In the second case, this longer wavelength light continues to be oscillated. To obtain the first case operation, the light emitting layers 11a and 11b and the barrier layer 12 are set such that the following relation is satisfied:

$$g_1(\lambda_2, n_1, p_1) > 0$$

where $g_1$ is a gain for wavelength $\lambda_2$ when the injected electron density in the light emitting layer 11a is $n_1$ and its injected hole density is $p_1$ (see FIG. 2B). In this case, the gain (>0) for the wavelength $\lambda_2$ as shown in FIG. 2B contributes to the oscillation, and the gain for the wavelength $\lambda_1$ is reduced leading to cassation of the oscillation of light having a longer wavelength $\lambda_1$. To obtain the second case operation, the light emitting layers 11a and 11b and the barrier layer 12 are set such that the above-mentioned gain $g_1$ satisfies the relation:

$$g_1(\lambda_2, n_1, p_1) \leq 0.$$

Especially, in the first case, the switching of oscillation wavelength is perfectly performed and hence this kind of device can have a wide range of application fields.

In room temperature, the mobility of holes in GaAs is 400 $cm^2$/V.s and this value is small compared with a value of 8800 $cm^2$/V.s of the mobility of electrons. Considering this fact, it is easier to realize an uneven injection of holes than that of electrons. So, it may be said that it is preferable to exchange n and p with each other in the structure as shown in FIG. 2A.

Figure 4:
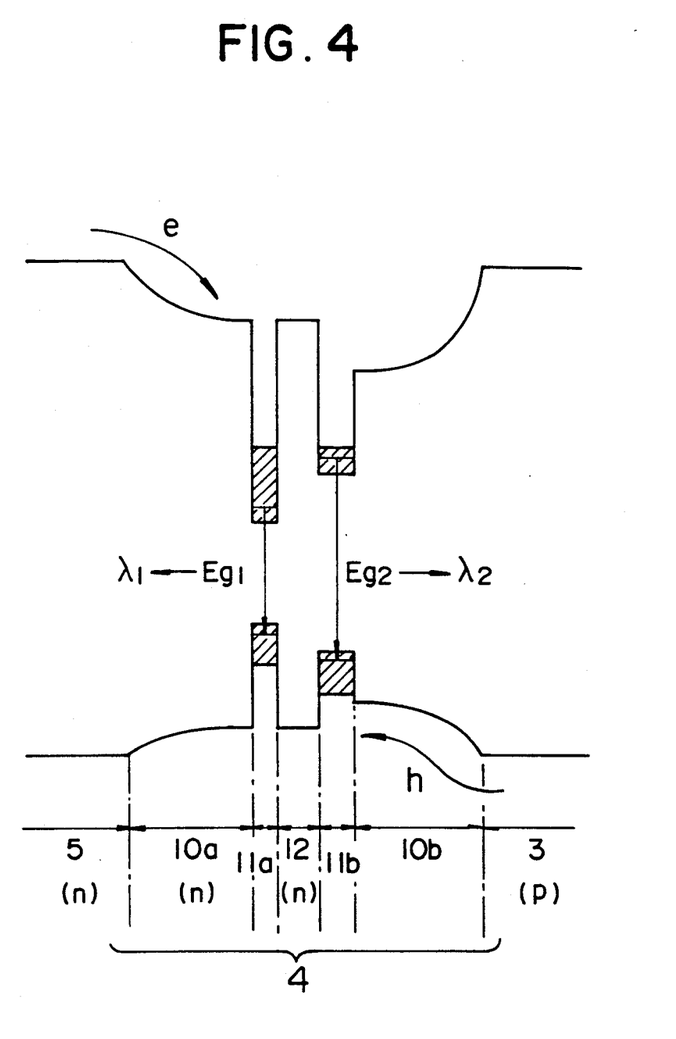
FIG. 4 is a representation of a band structure of a light waveguide portion in a second embodiment of a semiconductor laser device according to the present invention.

FIG. 4 shows this second embodiment. The operation and so forth thereof are substantially identical with those of the first embodiment of FIG. 2A with the exception that roles of holes and electrons are exchanged.

In the second embodiment, light emitting layers 11a and 11b are fulfilled with electrons, and the injection of holes is controlled. In this case, at least portions of the barrier layer 12 and/or SC layer 10a are doped with n type dopants, and the SC layer 10b having a smaller band gap is disposed at the side of the p-cladding layer 3 and the light emitting layer 11b having a larger band gap out of the two light emitting layers 11a and 11b is disposed near the p cladding layer 3.

Figure 5:
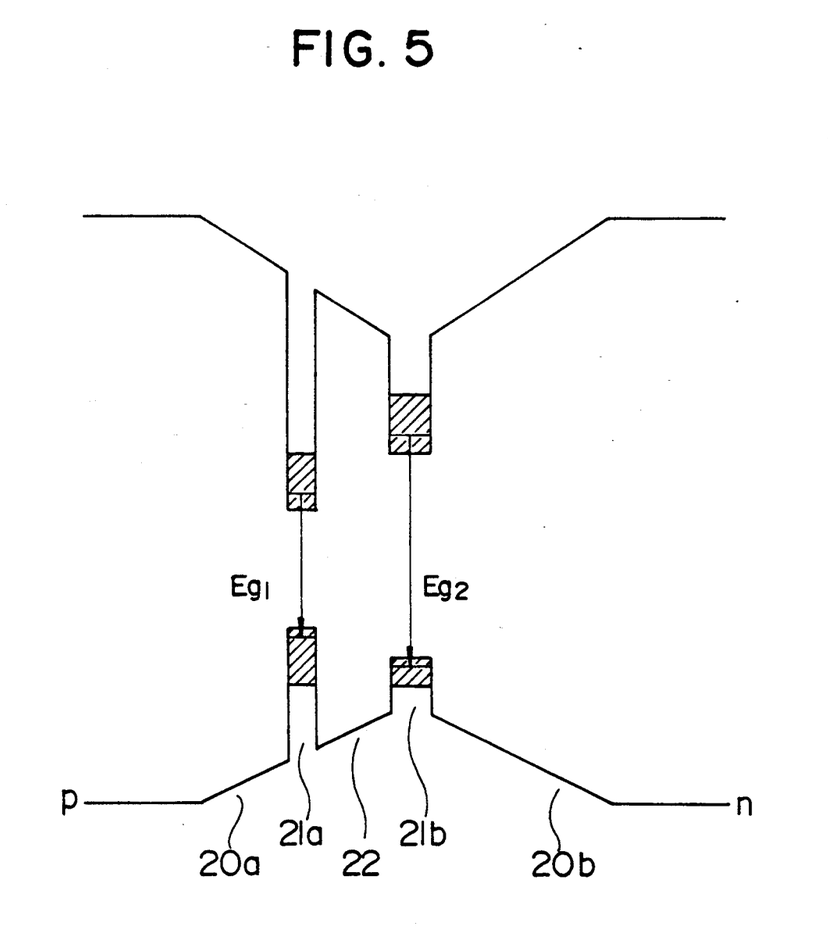
FIG. 5 is a representation of a band structure of a light waveguide portion in a third embodiment of a semiconductor laser device according to the present invention.

FIG. 5 shows the energy band profile of a third embodiment. In the third embodiment, a light emitting layer 21a having a smaller energy gap is formed as if the layer 21a were located in an SC layer 20a, and the composition of a barrier layer 22 is gradually changed in a direction of layer thickness. There are further provided the other light emitting layer 21b and the other SC layer 20b.

The operation principle thereof is substantially the same as that of the first embodiment if the height of the barrier layer 22, the thickness of the light emitting layer 21a and so forth satisfy the above-mentioned requirements. If a portion of the barrier layer 22 or SC layer 20a is doped with p-type dopants, the light emitting layers 21a and 21b are fulfilled with holes and electrons can be injected unevenly. As a result, gains of the light emitting layers 21a and 21b can be increased only by a small amount of current density.

Also in the third embodiment, p and n can be exchanged as is explained in the second embodiment.

Figure 6:
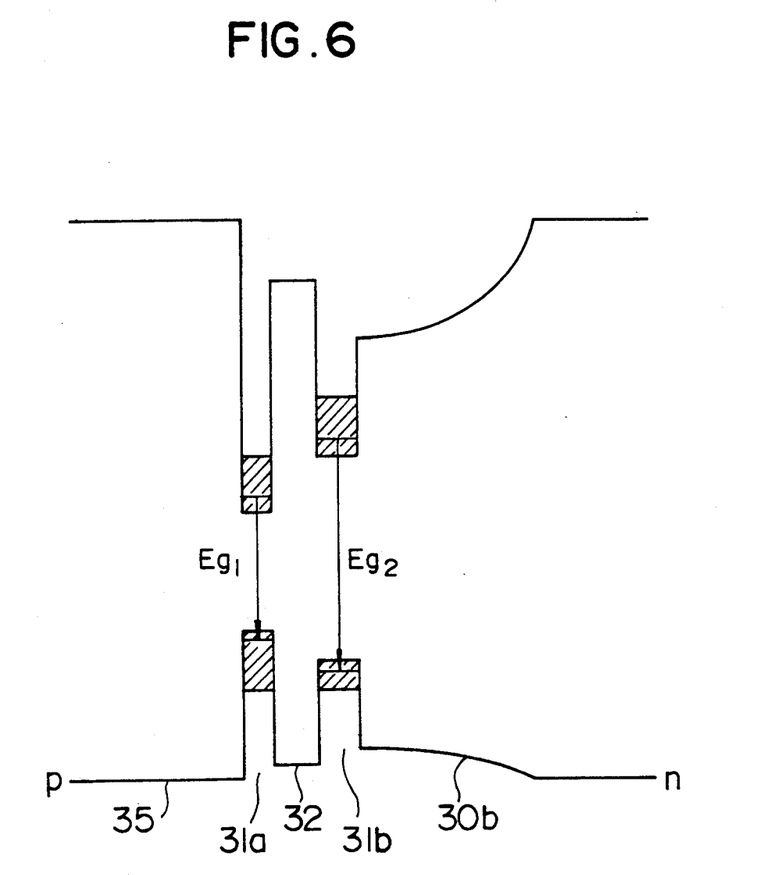
FIG. 6 is a representation of a band structure of a light waveguide portion in a fourth embodiment of a semiconductor laser device according to the present invention.

FIG. 6 shows the energy band structure of a fourth embodiment. In the fourth embodiment, one SC layer is made of the same composition as a cladding layer 35. In other words, the layer 35 functions as both cladding layer and SC layer. In the fourth embodiment, gains of the light emitting layers 31a and 31b can also be made large with a small amount of current density by fulfilling the light emitting layers 31a and 31b with holes and injecting electrons thereinto unevenly. There are further provided an SC layer 30b and a barrier layer 32.

Also in the fourth embodiment, p and n can be exchanged. The operation principle thereof is substantially the same as that of the first embodiment.

In the above-discussed embodiments, $Al_xGa_{1-x}As$ is used as semiconductor material, but any semiconductor material which can form a hetero-structure may be used. Further, as a structure for confining light and current, a ridge type waveguide is used, but any type of confining structure which is used in conventional semiconductor lasers may be used. Methods and fabrications therefor are explained in recent fifteen-year journals of "Applied Physics Letters" and "IEEE Journal of Quantum Electronics".

The laser device according to the present invention may be used as a highly effective optical amplifier which operates in a wide range of wavelength. In this case, a current slightly smaller than a laser oscillation threshold current is injected into the semiconductor laser device of this invention and light having a wavelength close to a laser oscillation wavelength is entered from an external light source through one end surface of the device to take out a light having the same wavelength as that of the incident light.

The laser device of this invention has a gain over a wider wavelength range than that of conventional devices, so that the device can be used as an optical amplifier which has a high efficiency and operates in a wide range of wavelength.

The laser device according to the present invention may also be used as a highly effective optical wavelength converter which operates in a wide range of wavelength. In this case, a current slightly smaller than a laser oscillation threshold current is injected into the semiconductor laser device of this invention and a light having a photon energy larger than a band gap of its light emitting layer is entered from an external light source through one end surface of the device. Then, carriers are generated and a light having a wavelength different from that of the incident light radiated from a light emitting layer of the device is emitted from its end surface. This emission light has a wavelength of or close to a wavelength $\lambda_1$ if the current beforehand biased is close to a threshold current for light of the oscillation wavelength $\lambda_1$. If the current beforehand biased is close to a threshold current for light of the oscillation wavelength $\lambda_2$, the emission light has a wavelength of or close to a wavelength $\lambda_2$. When the device of this invention is used, a highly effective optical wavelength converter which operates in a wider range of wavelength than conventional devices and easily oscillates light of a short wavelength can be realized.

As has been explained above, in the laser device of this invention, light emitting layers for different oscillation wavelengths are formed in a single light waveguide, so that a light emission position will not be changed even if the oscillation wavelength is changed.

Further, there is no need to provide separate current injection means for respective oscillation wavelengths, so that its fabrication is easy and a size of the device is about equal to conventional semiconductor lasers.

Further, since respective wavelength oscillations are performed by separate light emitting layers formed on a single light waveguide, so that the oscillation can be performed in a wider range of wavelength.

Further, lights of plural wavelength can selectively or simultaneously be oscillated without injecting a large amount of current with an increased resonator loss. This is attained by properly setting the band gap and thickness of a barrier layer. As a result, the efficiency of laser becomes extremely higher than the conventional laser devices, and a tunable laser which has an oscillation threshold current value twice less than that of conventional semiconductor lasers (not tunable) can be achieved. Especially, a continuous oscillation at room temperature can be achieved, which could not be obtained in conventional tunable devices having a wide range of oscillation wavelength.

When the laser device of this invention is utilized as an optical amplifier and an optical wavelength converter, such optical amplifier and optical wavelength converter have a high efficiency and operate in a wider range of wavelength than the conventional devices.

Figure 7:
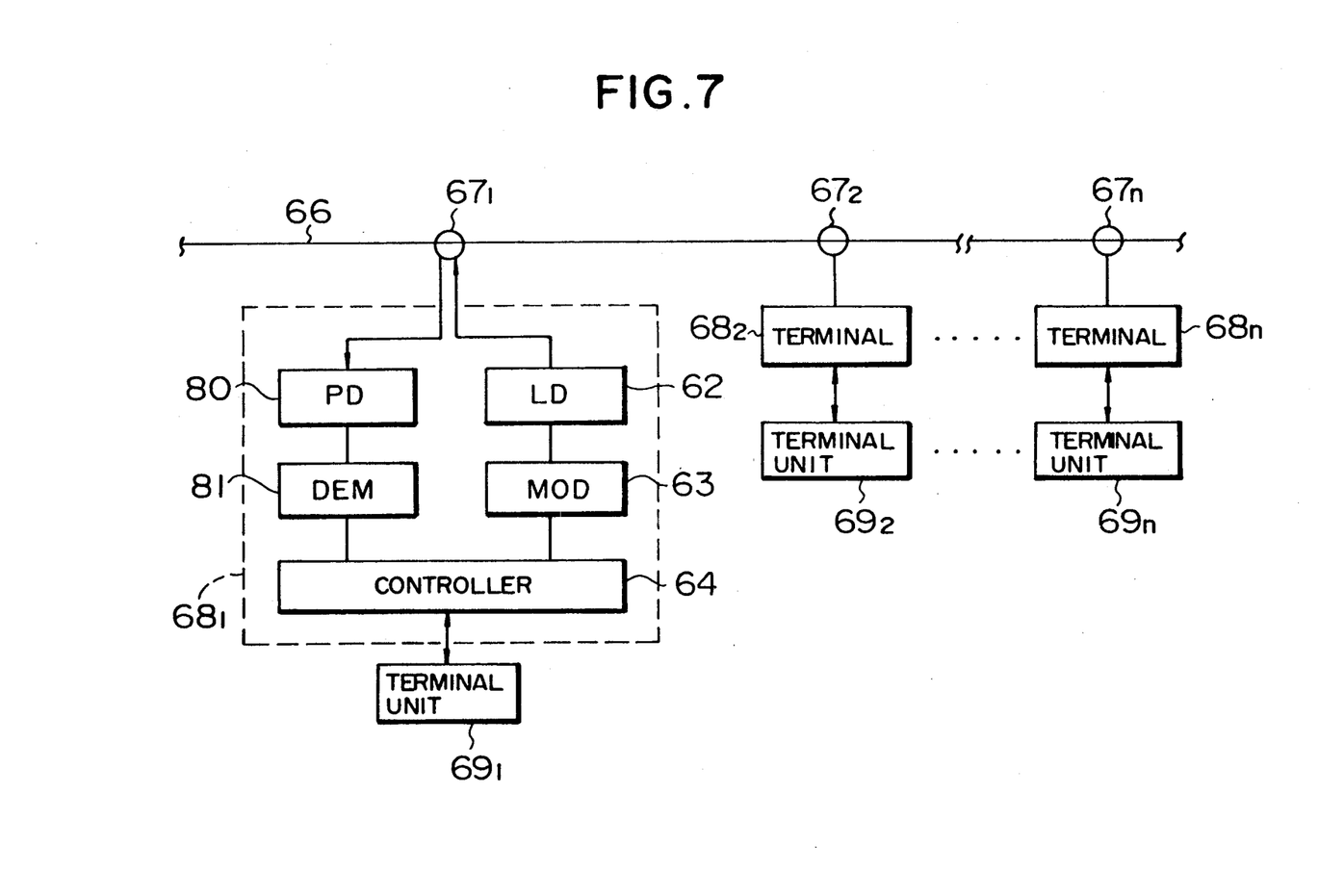
FIG. 7 is a block diagram showing an example in which the device of this invention is used as a laser diode.

FIG. 7 shows an example in which the device mentioned above is used as a laser diode in an optical communication system. In FIG. 7, a plurality of terminals $68_1, 68_2, \ldots, 68_n$ are connected to an optical fiber 66 to transmit light signals, through optical nodes $67, 67_2, \ldots, 67_n$. Connected to respective terminals are terminal units $69_1, 69_2, \ldots, 69_n$ which respectively include a keyboard, a display device and so forth. Each terminal has a light signal transmitter including a modulator circuit 63, a laser light source 62 and a light signal receiver comprising of a photodetector 80 and a demodulator circuit 81. The transmitter and receiver are controlled by a controller 64 in accordance with an instruction from the terminal unit $69_1$. The semiconductor laser device as discussed above can preferably be used as the laser diode source 62. In particular, a frequency division multiplexing optical communication can be attained by using the laser diode source as a tunable laser.

While there has been shown and described what are considered preferred embodiments of the present invention, it will be obvious to those skilled in the art that various changes and modifications may be made therein without departing from the invention as defined by the following claims.

What is claimed is:

1. A semiconductor laser device:
   a plurality of light emitting layers, band gaps of ground energy levels of said light emitting layers being different from each other;
   a barrier layer formed between said light emitting layers, a band gap of said barrier layer being larger than those of said light emitting layers; and
   a pair of light-electron confinement layers for sandwiching said light emitting layers and said barrier layer, band gaps of said light-electron confinement layers being different from each other;
   wherein said light emitting layers, said barrier layer and said light-electron confinement layers are formed such that, when carriers are injected into said light emitting layers, a carrier density of said light emitting layer having a larger band gap is made higher and a carrier density of said light emitting layer having a smaller band gap is made lower than at least one of cases where said barrier layer is omitted and where a pair of said light-electron confinement layers are symmetrically formed with respect to said light emitting layers.

2. A semiconductor laser device according to claim 1, further comprising a clad layer disposed outside of said light emitting layers, said barrier layer and said light-electron confinement layers.

3. A semiconductor laser device according to claim 1, wherein said light emitting layer having a smaller band gap is disposed near said light-electron confinement layer having a larger band gap.

4. A semiconductor laser device according to claim 1, wherein said a thickness of said light emitting layer having a smaller band gap is set to a value less than that which is required for carrier to decrease its energy to a value less than its potential energy at said barrier layer due to its nonelastic scattering.

5. A semiconductor laser device according to claim 2, wherein the band gap of one of said light-electron confinement layers is set to a value larger than that of said barrier layer and smaller than that of said clad layer and the band gap of the other one of said light-electron confinement layers is set to a value larger than that of said light emitting layer having a larger band gap and smaller than that of said clad layer.

6. A semiconductor laser device according to claim 5, wherein the band gaps of said light-electron confinement layers are gradually varied.

7. A semiconductor laser device according to claim 2, wherein said light-electron confinement layer disposed near said light emitting layer having a smaller band gap comprises said clad layer.

8. A semiconductor laser device according to claim 1, wherein the band gap of said barrier layer is gradually varied.

9. A semiconductor laser device according to claim 1, wherein at least one of said barrier layer, said light emitting layers and said light-electron confinement layers is doped with one of p type and n type dopants at least partially.

10. A semiconductor laser device according to claim 9, wherein said doping is p type and electrons are injected into said light emitting layers unevenly.

11. A semiconductor laser device according to claim 9, wherein said doping is n type and holes are injected into said light emitting layers unevenly.

12. A semiconductor laser device according to claim 1, further comprising a plurality of electrodes for injecting currents with different current densities in a direction of resonance of said device.

13. A method for driving a semiconductor laser device which includes a plurality of light emitting layers, a barrier layer formed between the light emitting layers, a pair of light-electron confinement layers for sandwiching the light emitting layers and the barrier layer and in which band gaps of ground levels of the light emitting layers are different from each other, a band gap of the barrier layer is larger than those of the light emitting layers, band gaps of the light-electron confinement layers are different from each other and the light emitting layers, the barrier layer and the light-electron confinement layers are formed such that, when carriers are injected into the light emitting layers, a carrier density of the light emitting layer having a larger band gap is made higher and a carrier density of the light emitting layer having a smaller band gap is made lower than at least one of cases where the barrier layer is omitted and where a pair of the light-electron confinement layers are symmetrically formed with respect to the light emitting layers, said method comprising the steps of:
injecting a current in a forward direction into said laser device;
controlling an amount of the current; and
performing a laser oscillation of light having a wavelength corresponding to any desired one of the band gaps of the light emitting layers.

14. A method for driving a semiconductor laser device which includes a plurality of light emitting layers, a barrier layer formed between the light emitting layers, a pair of light-electron confinement layers for sandwiching the light emitting layers and the barrier layer and in which band gaps of ground levels of the light emitting layers are different from each other, a band gap of the barrier layer is larger than those of the light emitting layers, band gaps of the light-electron confinement layers are different from each other and the light emitting layers, the barrier layer and the light-electron confinement layers are formed such that, when carriers are injected into the light emitting layers, a carrier density of the light emitting layer having a larger band gap is made higher and a carrier density of the light emitting layer having a smaller band gap is made lower than at least one of cases where the barrier layer is omitted and where a pair of the light-electron confinement layers are symmetrically formed with respect to the light emitting layers, said method comprising the steps of:
injecting a current having an amount slightly smaller than that of a threshold current for performing a laser oscillation, into the device;
causing an incident light having a wavelength close to that of a laser oscillation light to enter the device through its one end surface; and
taking out a light having the same wavelength as that of the incident light through the other end surface of the device.

15. A method for driving a semiconductor laser device which includes a plurality of light emitting layers, a barrier layer formed between the light emitting layers, a pair of light-electron confinement layers for sandwiching the light emitting layers and the barrier layer and in which band gaps of ground levels of the light emitting layers are different from each other, a band gap of the barrier layer is larger than those of the light emitting layers, band gaps of the light-electron confinement layers are different from each other and the light emitting layers, the barrier layer and the light-electron confinement layers are formed such that, when carriers are injected into the light emitting layers, a carrier density of the light emitting layer having a larger band gap is made higher and a carrier density of the light emitting layer having a smaller band gap is made lower than at least one of cases where the barrier layer is omitted and where a pair of the light-electron confinement layers are symmetrically formed with respect to the light emitting layers, said method comprising the steps of:
injecting a current having an amount slightly smaller than that of a threshold current for performing a laser oscillation, into the device;
causing an incident light having a wavelength close to that of a laser oscillation light to enter the device through its one end surface; and
taking out a light having a wavelength different from that of the incident light through the other end surface of the device.

16. A semiconductor laser device comprising:

a first light emitting layer having a band gap of a ground energy level;

a second light emitting layer having a smaller band gap of a ground energy level than the band gap of said first light emitting layer;

a barrier layer provided between said first and second light emitting layers, a band gap of said barrier layer being larger than those of said first and second light emitting layers;

a first light-electron confinement layer provided on a side of said first light emitting layer which is remote from said barrier layer, a band gap of said first light-electron confinement layer being inclined such that it decreases toward said first light emitting layer; and a second light-electron confinement layer provided on a side of said second light emitting layer which is remote from said barrier layer, a band gap of said second light-electron confinement layer being inclined such that it decreases toward said second light emitting layer, wherein the band gap of the portion of said first light-electron confinement layer which is closest to said first light emitting layer is smaller than the band gap of the portion of said second light-electron confinement layer which is closest to said second light emitting layer.

17. A semiconductor laser device according to claim 16, further comprising first and second clad layers for sandwiching said first and second light emitting layers, first and second light-electron confinement layers and said barrier layers.

18. A semiconductor laser device according to claim 16, wherein said second light emitting layer has a thickness which ensures that a carrier decreases its energy to a potential energy at said barrier layer when subjected to nonelastic scattering or below.

19. A semiconductor laser device according to claim 16, wherein the band gap of the portion of said first light-electron confinement layer which is closest to said first light emitting layer is larger than the band gap of the ground energy level of said first light emitting layer, and is smaller than the band gap of said barrier layer, while the band gap of the portion of said second light-electron confinement layer which is closest to said second light emitting layer is equal to the band gap of said barrier layer.

20. A semiconductor laser device according to claim 16, wherein the band gap of said barrier layer gradually varies.

21. A semiconductor laser device according to claim 16, wherein said barrier layer is doped with either p-type or n-type dopants.

22. A semiconductor laser device according to claim 16, further comprising a plurality of electrodes for injecting currents at different current densities in a direction of resonance of said device.

23. A method of driving a semiconductor laser device including a first light emitting layer having a band gap of a ground energy level, a second light emitting layer having a smaller band gap of a ground energy level than the band gap of said first light emitting layer, a barrier layer provided between said first and second light emitting layers, a band gap of said barrier layer being larger than those of said first and second light emitting layers, a first light-electron confinement layer provided on a side of said first light emitting layer which is remote from said barrier layer, a band gap of said first light-electron confinement layer being inclined such that it decreases toward said first light emitting layer, and a second light-electron confinement layer provided on a side of said second light emitting layer which is remote from said barrier layer, a band gap of said second light-electron confinement layer being inclined such that it decreases toward said second light emitting layer, the band gap of the portion of said first light-electron confinement layer which is closest to said first light emitting layer being smaller than the band gap of the portion of said second light-electron confinement layer which is closest to said second light emitting layer, said method comprising the steps of:

injecting a current into said laser device in a forward direction;

controlling an amount of current; and generating a laser oscillation of light having a wavelength corresponding to the band gap of any desired one of said first and second light emitting layers.

24. A method of driving a semiconductor laser device including a first light emitting layer having a band gap of a ground energy level, a second light emitting layer having a smaller band gap of a ground energy level than the band gap of said first light emitting layer, a barrier layer provided between said first and second light emitting layers, a band gap of said barrier layer being larger than those of said first and second light emitting layers, a first light-electron confinement layer provided on a side of said first light emitting layer which is remote from said barrier layer, a band gap of said first light-electron confinement layer being inclined such that it decreases toward said first light emitting layer, and a second light-electron confinement layer provided on a side of second light emitting layer which is remote from said barrier layer, a band gap of said second light-electron confinement layer being inclined such that it decreases toward said second light emitting layer, the band gap of the portion of said first light-electron confinement layer which is closest to said first light emitting layer being smaller than the band gap of the portion of said second light-electron confinement layer which is closest to said second light emitting layer, said method comprising the steps of:

injecting a current in an amount slightly smaller than that of a threshold current which generates a laser oscillation of said laser device;

receiving a light having a wavelength close to that of the laser oscillated light from one end surface of said device; and taking out a light having the same wavelength as that of the incident light from the other end surface of said device.

25. A method of driving a semiconductor laser device including a first light emitting layer having a band gap of a ground energy level, a second light emitting layer having a smaller band gap of a ground energy level than the band gap of said first light emitting layer, a barrier layer provided between said first and second light emitting layers, a band gap of said barrier layer being larger than those of said first and second light emitting layers, a first light-electron confinement layer provided on a side of said first light emitting layer which is remote from said barrier layer, a band gap of said first light-electron confinement layer being inclined such that it decreases toward said first light emitting layer, and a second light-electron confinement layer provided on a side of said second light emitting layer which is remote from said barrier layer, a band gap of said second light-electron confinement layer being inclined such that it decreases toward said second light emitting layer, the band gap of the portion of said first light-electron confinement layer which is closest to said first light emitting layer being smaller than the band gap of the portion of said second light-electron confinement layer which is closest to said second light emitting layer, said method comprising the steps of:

injecting a current in an amount slightly smaller than that of a threshold current which generates a laser oscillation of said laser device;

receiving a light having a wavelength close to that of the laser oscillated light from one end surface of said device; and     taking out a light having a different wavelength from that of the incident light from the other end surface of said device.

26. A semiconductor laser device comprising:

a semiconductor substrate;

a first clad layer provided on said substrate, said first clad layer being made of a first conductive type semiconductor;

a first light emitting layer provided on said first clad layer, said first light emitting layer having a band gap of a ground energy level;

a first light-electron confinement layer provided between said first clad layer and said first light emitting layer, a band gap of said first light-electron confinement layer being inclined such that it decreases toward said first light emitting layer;

a second light emitting layer provided on said first light emitting layer, said second light emitting layer having a smaller band gap of a ground energy level than the band gap of said first light emitting layer;

a barrier layer provided between said first and second light emitting layers, a band gap of said barrier layer being larger than those of said first and second light emitting layers;

a second light-electron confinement layer provided on said second light emitting layer, said second light-electron confinement layer being made of a second conductive type semiconductor, a band gap of said second light-electron confinement layer being inclined such that it decreases toward said second light emitting layer; and     an electrode for injecting a current into said first and second light emitting layers, the band gap of the portion of said first light-electron confinement layer which is closest to said first light emitting layer being smaller than the band gap of the portion of said second light-electron confinement layer which is closest to said second light emitting layer.

27. A semiconductor laser device according to claim 26, wherein said first clad layer is made of a n-type semiconductor, while said second clad layer is made of p-type semiconductor.

28. A semiconductor laser device according to claim 26, wherein said first clad layer is made of a p type semiconductor, while said second clad layer is made of an n type semiconductor.

29. A semiconductor laser device according to claim 26, wherein said second light emitting layer has a thickness which ensures that a carrier decreases its energy to a potential energy at said barrier layer when subjected to nonelastic scattering or below.

30. A semiconductor laser device according to claim 26, wherein the band gap of the portion of said first light-electron confinement layer which is closest to said first light emitting layer is larger than the band gap of the ground energy level of said first light emitting layer, and is smaller than the band gap of said barrier layer, while the band gap of the portion of said second light-electron confinement layer which is closest to said second light emitting layer is equal to the band gap of said barrier layer.

31. A semiconductor laser device according to claim 26, wherein the band gap of said barrier layer gradually varies.

32. A semiconductor laser device according to claim 26, wherein said barrier layer is doped with either p type or n type dopants.

33. A semiconductor laser device according to claim 26, wherein said electrode is divided into a plurality of electrode portions in a direction of resonance of said device.

34. A method of driving a semiconductor laser device including a semiconductor substrate, a first clad layer provided on said substrate, said first clad layer being made of a first conductive type semiconductor, a first light emitting layer provided on said first clad layer, said first light emitting layer having a band gap of a ground energy level, a first light-electron confinement layer provided between said first clad layer and said first light emitting layer, a band gap of said first light-electron confinement layer being inclined such that it decreases toward said first light emitting layer, a second light emitting layer provided on said first light emitting layer, said second light emitting layer having a smaller band gap of a ground energy level than the band gap of said first light emitting layer, a barrier layer provided between said first and second light emitting layers, a band gap of said barrier layer being larger than those of said first and second light emitting layers, a second light-electron confinement layer provided on said second light emitting layer, said second light-electron confinement layer being made of a second conductive type semiconductor, a band gap of said second light-electron confinement layer being inclined such that it decreases toward said second light emitting layer, and an electrode for injecting a current into said first and second light emitting layers, the band gap of the portion of said first light-electron confinement layer which is closest to said first light emitting layer being smaller than the band gap of the portion of said second light-electron confinement layer which is closest to said second light emitting layer, said method comprising the steps of:

injecting a current into said laser device in a forward direction;

controlling an amount of current; and generating a laser oscillation of light having a wavelength corresponding to the band gap of any desired one of said first and second light emitting layers.

35. A method of driving a semiconductor laser device including a semiconductor substrate, a first clad layer provided on said substrate, said first clad layer being made of a first conductive type semiconductor, a first light emitting layer provided on said first clad layer, said first light emitting layer having a band gap of a ground energy level, a first light-electron confinement layer provided between said first clad layer and said first light emitting layer, a band gap of said first light-electron confinement layer being inclined such that it decreases toward said first light emitting layer, a second light emitting layer provided on said first light emitting layer, said second light emitting layer having a smaller band gap of a ground energy level than the band gap of said first light emitting layer, a barrier layer provided between said first and second light emitting layers, a band gap of said barrier layer being larger than those of said first and second light emitting layers, a second light-electron confinement layer provided on said second light emitting layer, said second light-electron confinement layer being made of a second conductive type semiconductor, a band gap of said second light-electron confinement layer being inclined such that it decreases toward said second light emitting layer, and an electrode for injecting a current into said first and second light emitting layers, the band gap of the portion of said first light-electron confinement layer which is closest to said first light emitting layer being smaller than the band gap of the portion of said second light-electron confinement layer which is closest to said second light emitting layer, said method comprising the steps of:

injecting a current in an amount slightly smaller than that of a threshold current which generates a laser oscillation of said laser device;

receiving a light having a wavelength close to that of the laser oscillated light from one end surface of said device; and taking out a light having the same wavelength as that of the incident light from the other end surface of said device.

36. A method of driving a semiconductor laser device including a semiconductor substrate, a first clad layer provided on said substrate, said first clad layer being made of a first conductive type semiconductor, a first light emitting layer provided on said first clad layer, said first light emitting layer having a band gap of a ground energy level, a first light-electron confinement layer provided between said first clad layer and said first light emitting layer, a band gap of said first light-electron confinement layer being inclined such that it decreases toward said first light emitting layer, a second light emitting layer provided on said first light emitting layer, said second light emitting layer having a smaller band gap of a ground energy level than the band gap of said first light emitting layer, a barrier layer provided between said first and second light emitting layers, a band gap of said barrier layer being larger than those of said first and second light emitting layers, a second light-electron confinement layer provided on said second light emitting layer, said second light-electron confinement layer which is closest to said first light emitting layer being made of a second conductive type semiconductor, a band gap of said second light-electron confinement layer being inclined such that it decreases toward said second light emitting layer, and an electrode for injecting a current into said first and second light emitting layers, the band gap of the portion of said first light-electron confinement layer being smaller than the band gap of the portion of said second light-electron confinement layer which is closest to said second light emitting layer, said method comprising the steps of:

injecting a current in an amount slightly smaller than that of a threshold current which generates a laser oscillation of said laser device;

receiving a light having a wavelength close to that of the laser oscillated light from one end surface of said device; and taking out a light having a different wavelength from that of the incident light from the other end surface of said device.

37. An optical communication system comprising:
a plurality of terminals, each of said terminals including a light transmitter including a semiconductor laser device, and a light receiver; and
optical transmission means for connecting said plurality of terminals with each other,
wherein said semiconductor laser device includes:
a plurality of light emitting layers, band gaps of ground energy levels of said light emitting layers being different from each other;
a barrier layer formed between said light emitting layers, a band gap of said barrier layer being larger than those of said light emitting layers; and
a pair of light-electron confinement layers for sandwiching said light emitting layers and said barrier layer, band gaps of said light-electron confinement layers being different from each other;
wherein said light emitting layers, said barrier layer and said light-electron confinement layers are formed such that, when carriers are injected into said light emitting layers, a carrier density of said light emitting layer having a larger band gap is made higher and a carrier density of said light emitting layer having a smaller band gap is made lower than at least one of cases where said barrier layer is omitted and where a pair of said light-electron confinement layers are symmetrically formed with respect to said light emitting layers.

38. An optical communication system according to claim 37, wherein said optical transmission means comprises an optical fiber.

39. An optical communication system according to claim 37, wherein said light transmitter further includes a modulating circuit connected to said semiconductor laser device.

40. An optical communication system according to claim 37, wherein said light receiver includes a light detector for detecting a light signal, and a demodulating circuit connected to said optical detector.

41. An optical communication system according to claim 37, wherein each of said terminals further includes a controller for controlling said light transmitter and said light receiver.

42. An optical communication system according to claim 37, further comprising a terminal unit connected to each of said terminals, said terminal unit including a keyboard and a display device.

43. An optical communication system comprising:
a plurality of terminals, each of said terminals including a light transmitter including a semiconductor laser device, and a light receiver; and
optical transmission means for connecting said plurality of terminals with each other,
wherein said semiconductor laser device includes:
a first light emitting layer having a band gap of a ground energy level;
a second light emitting layer having a smaller band gap of a ground energy level than the band gap of said first light emitting layer;
a barrier layer provided between said first and second light emitting layers, a band gap of said barrier layer being larger than those of said first and second light emitting layers;
a first light-electron confinement layer provided on a side of said first light emitting layer which is remote from said barrier layer, a band gap of said first light-electron confinement layer being inclined such that it decreases toward said first light emitting layer; and a second light-electron confinement layer provided on a side of said second light emitting layer which is remote from said barrier layer, a band gap of said second light-electron confinement layer being inclined such that it decreases toward said second light emitting layer, wherein the band gap of the portion of said first light-electron confinement layer which is closest to said first light emitting layer is smaller than the band gap of the portion of said second light-electron confinement layer which is closest to said second light emitting layer.

44. An optical communication system according to claim 43, wherein said optical transmission means comprises an optical fiber.

45. An optical communication system according to claim 43, wherein said light transmitter further includes a modulating circuit connected to said semiconductor laser device.

46. An optical communication system according to claim 43, wherein said light receiver includes a light detector for detecting a light signal, and a demodulating circuit connected to said optical detector.

47. An optical communication system according to claim 43, wherein each of said terminals further includes a controller for controlling said light transmitter and said light receiver.

48. An optical communication system according to claim 43, further comprising a terminal unit connected to each of said terminals, said terminal unit including a keyboard and a display device.

49. An optical communication system comprising:
a plurality of terminals, each of said terminals including a light transmitter including a semiconductor laser device, and a light receiver; and
optical transmission means for connecting said plurality of terminals with each other,
wherein said semiconductor laser device includes:
a semiconductor substrate;
a first clad layer provided on said substrate, said first clad layer being made of a first conductive type semiconductor;
a first light emitting layer provided on said first clad layer, said first light emitting layer having a band gap of a ground energy level;
a first light-electron confinement layer provided between said first clad layer and said first light emitting layer, a band gap of said first light-electron confinement layer being inclined such that it decreases toward said first light emitting layer;
a second light emitting layer provided on said first light emitting layer, said second light emitting layer having a smaller band gap of a ground energy level than the band gap of said first light emitting layer;
a barrier layer provided between said first and second light emitting layers, a band gap of said barrier layer being larger than those of said first and second light emitting layers;
a second light-electron confinement layer provided on said second light emitting layer, said second light-electron confinement layer being made of a second conductive type semiconductor, a band gap of said second light-electron confinement layer being inclined such that it decreases toward said second light emitting layer; and
an electrode for injecting a current into said first and second light emitting layers, the band gap of the portion of said first light-electron confinement layer which is closest to said first light emitting layer being smaller than the band gap of the portion of said second light-electron confinement layer which is closest to said second light emitting layer.

50. An optical communication system according to claim 49, wherein said optical transmission means comprises an optical fiber.

51. An optical communication system according to claim 49, wherein said light transmitter further includes a modulating circuit connected to said semiconductor laser device.

52. An optical communication system according to claim 49, wherein said light receiver includes a light detector for detecting a light signal, and a demodulating circuit connected to said optical detector.

53. An optical communication system according to claim 49, wherein each of said terminals further includes a controller for controlling said light transmitter and said light receiver.

54. An optical communication system according to claim 49, further comprising a terminal unit connected to each of said terminals, said terminal unit including a keyboard and a display device.

* * * * *